(12) United States Patent
Burghardt et al.

(10) Patent No.: US 12,105,121 B2
(45) Date of Patent: Oct. 1, 2024

(54) CURRENT SENSOR COMPRISING A MAGNETIC FIELD SENSOR IN A V-SHAPED ARRANGEMENT

(71) Applicant: Methode Electronics Malta Ltd., Birkirkara (MT)

(72) Inventors: Florian Burghardt, Neuching (DE); Ibai Sarria, Munich (DE); Julius Beck, Munich (DE); Allen Carl Bonnici, Mosta (MT)

(73) Assignee: Methode Electronics Malta Ltd., Birkirkara (MT)

( * ) Notice: Subject to any disclaimer, the term of this patent is extended or adjusted under 35 U.S.C. 154(b) by 0 days.

(21) Appl. No.: 17/836,243

(22) Filed: Jun. 9, 2022

(65) Prior Publication Data

US 2022/0397590 A1 Dec. 15, 2022

(30) Foreign Application Priority Data

Jun. 11, 2021 (DE) .............................. 102021115237

(51) Int. Cl.
*G01R 15/20* (2006.01)
*G01R 19/00* (2006.01)

(52) U.S. Cl.
CPC ......... *G01R 15/202* (2013.01); *G01R 15/205* (2013.01); *G01R 19/0092* (2013.01)

(58) Field of Classification Search
CPC .. G01R 15/202; G01R 15/205; G01R 15/207; G01R 19/0092
See application file for complete search history.

(56) References Cited

U.S. PATENT DOCUMENTS

| | | | | |
|---|---|---|---|---|
| 6,731,105 | B1* | 5/2004 | Hoyle ................. | G01R 15/207 324/117 R |
| 8,878,520 | B2* | 11/2014 | Tamura ................ | G01R 33/02 324/117 R |
| 9,201,101 | B2* | 12/2015 | Nomura .................. | G01V 3/08 |
| 11,500,014 | B2* | 11/2022 | Guan ................... | G01R 15/207 |
| 2007/0090825 | A1* | 4/2007 | Shoji ................... | G01R 15/205 324/117 R |
| 2014/0103918 | A1* | 4/2014 | Nomura ............. | G01R 19/0092 324/244 |
| 2018/0038897 | A1* | 2/2018 | Milano ............... | G01R 15/202 |
| 2019/0204396 | A1* | 7/2019 | Ogomi ................ | G01R 33/096 |
| 2020/0088768 | A1* | 3/2020 | Schläfli ............... | G01R 33/022 |

* cited by examiner

*Primary Examiner* — Dominic E Hawkins
(74) *Attorney, Agent, or Firm* — Greenberg Traurig, LLP

(57) ABSTRACT

A current sensor includes a current transferring conductor to conduct current and four magnetic field sensors with the magnetic field sensors being divided into two pairs of magnetic field sensors. The two magnetic field sensors are arranged in a V-shaped manner on one face of the current transferring conductor. Two magnetic field sensors are arranged in a V-shaped manner on the other face of the current transferring conductor. Of the magnetic field sensors arranged in a V-shaped manner, the ones of each side running parallel to each other form one pair.

19 Claims, 11 Drawing Sheets

CURRENT SENSOR COMPRISING A MAGNETIC FIELD SENSOR IN A V-SHAPED ARRANGEMENT

RELATED APPLICATION DATA

This application claims priority benefit to German patent ser. no. DE 10 2021 115 237.2 filed Jun. 11, 2021, the disclosure of which is incorporated by reference herein.

DESCRIPTION

The disclosure is directed to a current sensor that includes a current transferring conductor to conduct current and four magnetic field sensors. The magnetic field sensors are divided into two pairs of magnetic field sensors. The two magnetic field sensors are arranged in a V-shaped manner on one face of the current transferring conductor. Two magnetic field sensors are arranged in a V-shaped manner on the other face of the current transferring conductor. Of the magnetic field sensors arranged in a V-shaped manner, the ones of each side running parallel to each other form one pair.

BACKGROUND ART

The US 2021/0048454 A1 discloses an integrated current-measuring apparatus including a printed circuit board. The printed circuit board is designed as a shunt resistor. It includes a resistive element which has a present resistance and terminals extending from both sides of the resistive element. The resistor is attached to a bottom surface of the printed circuit board. A hall sensor is mounted on a top surface of the printed circuit board to face the shunt resistor with the printed circuit board being imposed between the hall sensor and the shunt resistor.

OBJECTIVE OF THE INVENTION

The object of the invention is to provide a current sensor that can be fitted onto current conductors of different sizes. Also, the current sensor should be very sensitive to external magnetic fields. A further objective of the invention is to provide a current sensor which is inexpensive, needs less building space compared to the ones currently available and which is easy to install.

Solution

This objective is achieved by a current sensor comprising at least one support element to be used in connection with a current transferring conductor.

The support element carries at least one magnetic field sensor. The support element has at least one face on which at least one magnetic field sensor is arranged.

The magnetic field sensor according to the invention is a sensor which is sensitive preferably to the direction of the magnetic field.

At least two magnetic field sensors differ from each other in respect of an angular orientation of the individual magnetic field sensor relative to a longitudinal axis of the current transferring conductor.

Alternatively, they differ from each other in respect of a vertical distance of the individual magnetic field sensor relative to the current transferring conductor.

Current flows through the current transferring conductor producing a magnetic field.

The support element is positioned in the vicinity of the current transferring conductor.

Also, the support element is arranged in an angle relative to the magnetic field created by the current transferring conductor.

A sensitivity of the magnetic field sensor regarding the magnetic field depends on the angular orientation of the magnetic field sensor relative to the magnetic field generated by the current flowing through the current transferring conductor.

Current Sensor

Commonly known current sensors measure a current flowing through a current transferring conductor. The current flowing through the current transferring conductor produces a magnetic field in the area around the current transferring conductor. The current transferring conductor may be designed as a busbar.

Instead of a so called busbar, any other current transferring conductor can be employed.

Within the current sensor magnetic field sensors are arranged. There are various options where and how the magnetic field sensors can be placed relative to the busbar.

Magnetic field sensors are used for generating and/or detecting a magnetic field.

According to the invention magnetic field sensors also comprise different kinds of magnetic field sensors, including, among other sensors, sensors measuring a so called anisotropic magneto restrictive effect (AMR-sensors) or sensors measuring a so called giant magnetoresistance (GMR-sensors) or sensors measuring a so called tunnel magnetoresistance (TMR-sensor). The above list is only meant to show a number of examples. The list is not meant to be comprehensive. Magnetic field sensors of other types or designs can also be used.

In the following, by way of example, the invention relies on a magnetic field sensor to measure a magnetic field generated by a current flowing through a current transferring conductor.

The magnetic field sensor, measuring a magnetic field generated by a current flowing through a current transferring conductor, can be a Hall effect sensor. The current sensor can also be a flux gate sensor or a magneto-resistive current sensor.

The Hall effect sensor senses a magnetic field which is produced by the magnetic system.

The Hall effect sensor is a basic magnetic field sensor which requires signal conditioning to make the output usable for most applications.

A flux gate sensor commonly works on similar measurement principle as the Hall effect sensor referred to above.

With both sensors (Hall effect sensor and flux gate sensor) the magnetic field is created by a current, wherein the measuring is performed by a specific sensing element.

Contrary to the Hall effect sensor, the flux gate sensor uses a saturable inductor instead of a Hall effect sensor.

The magnetic field sensor has a sensitivity which is defined by either the location or the angular orientation or by a distance of the magnetic field sensor relative to the current transferring conductor.

The magnetic field sensor is referred to in more detail below.

The current sensor measures a magnetic field generated by the current flowing through the current transferring conductor.

Commonly known current sensors include techniques such as a shunt resistor, a current transformer and/or a magnetic-field based transducer.

The current sensor generates a signal proportional to the sensed magnetic field.

The signal generated by the current sensor can be used to display the measured current for example in an ammeter.

The magneto-resistive current sensor is usually designed as a two terminal device changing its resistance parabolically with the applied magnetic field.

The variation of the resistance of the magneto-resistor is due to the magnetic field. This is also known as the magneto-resistive effect.

The measurement of the electric current can rely on a Faraday effect or on a Hall effect sensor.

For measuring the electric current, a flux gate sensor or a shunt resistor can be employed.

Also, a fiber optic current sensor can be used to measure the electric current. It goes without saying that an electric current can be detected and/or measured by other technical means as well.

The techniques used for measuring the electric current can be classified depending upon the underlying physical principles.

Sensing Channel

Even though there may be two or more sensing channels arranged in the vicinity of the current transferring conductor, in the following it is assumed that there are two sensing channels with each of the sensing channels having two magnetic field sensors.

The current sensor may comprise at least one first sensing channel and one second sensing channel.

The first sensing channel and the second sensing channel may comprise at least two magnetic field sensors each. Both magnetic field sensors may be aligned axially or radially relative to one another.

The magnetic field sensors are arranged that they split into at least two channels. To reduce complexity, the magnetic field sensors of the two channels can be connected in a way that only one sensing channel is required which still achieves the same stable result but only requires one electronic channel.

In other words, the two channels are merged into one single channel.

The merged single channel leads to the same result as obtained by subtracting a signal value in Ampere (A) sensed by one sensing channel (also referred to as channel CH2) from the signal value in Ampere (A) sensed by another sensing channel (also referred to as CH1).

In the merged single channel all magnetic field sensors, previously split into two different channels, are now combined in one single electronic channel.

Each sensing channel comprises at least two magnetic field sensors. One magnetic field sensor of a pair of magnetic field sensors of one sensing channel faces towards an upper face of the current transferring conductor. A second magnetic field sensor of the pair of magnetic field sensors faces towards a lower face of the current transferring conductor.

The upper face of the current transferring conductor and the lower face of the current transferring conductor are arranged as two faces of one current transferring conductor and being arranged opposite to each other.

Of the two magnetic field sensors of the sensing channel, one magnetic field sensor is aligned towards the upper face of the current transferring conductor. Whereas the second magnetic field sensor of the sensing channel is aligned towards the lower face of the current transferring conductor.

The at least four magnetic field sensors are each arranged adjacent to the current transferring conductor.

Relative to the individual sensitivity of the individual magnetic field sensor, both sensing channels (first and second sensing channel) may have different sensitivities.

Each sensing channel of the current sensor comprises at least two magnetic field sensors. One magnetic field sensor of the pair of magnetic field sensors of one sensing channel faces towards the upper face of the current transferring conductor. The second magnetic field sensor of the pair of magnetic field sensors faces towards the lower face of the current transferring conductor.

The magnetic field sensors are arranged axially relative to the current transferring conductor.

Also, relative to a longitudinal axis of the current transferring conductor the two magnetic field sensors of one sensing channel have the same angle of inclination. The opposing angles of inclination of the two sensing channels relative to the longitudinal axis of the current transferring conductor lead to a V-shaped arrangement of the two sensing channels of one sensing channel relative to each other.

For better understanding the first channel and the second channel are also referred to as CH1 (first channel) and CH2 (second channel), respectively.

Two channels CH1 and CH2 are arranged relative the current transferring conductor. Each channel CH1 and CH2 has two magnetic field sensors.

One magnetic field sensor of each of the two channels CH1 and CH2 points towards the upper face of the current transferring conductor. The other magnetic field sensor of each of the two channels CH1 and CH2 points towards the lower face of the current transferring conductor. In other words, if one pair of magnetic field sensors facing towards the upper face of the current transferring conductor one magnetic field sensor is assigned to the channel CH1. The other magnetic field sensor of the pair of magnetic field sensors facing towards the upper face of the current transferring conductor is assigned to the channel CH2.

Also, of one pair of magnetic field sensors facing towards the lower face of the current transferring conductor one magnetic field sensor is assigned to the channel CH1. The other magnetic field sensor of the pair of magnetic field sensors facing towards the lower face of the current transferring conductor is assigned to the channel CH2.

However, the pair of magnetic field sensors facing towards the upper face of the current transferring conductor and being assigned to different sensing channels CH1 and CH2, are positioned in a V-shaped arrangement.

Also, the pair of magnetic field sensors facing towards the lower face of the current transferring conductor and being assigned to different sensing channels CH1 and CH2, are positioned in a V-shaped arrangement.

In the V-shaped arrangement the two magnetic field sensors of different sensing channels CH1 and CH2 are arranged in an acute one sensing channel relative to the longitudinal axis of the current transferring conductor.

The two magnetic field sensors facing the upper face of the current transferring conductor are each arranged at an acute angle to the longitudinal axis. In the arrangement at an acute angle to the longitudinal axis, the two magnetic field sensors are also arranged at an acute angle to each other.

The two magnetic field sensors facing the lower face of the current transferring conductor are each arranged at an acute angle to the longitudinal axis. In the arrangement at an acute angle to the longitudinal axis, the two magnetic field sensors are also arranged at an acute angle to each other.

One pair of two magnetic field sensors is aligned to the upper side of the current transferring conductor and to the lower side of the current transferring conductor, respectively. The magnetic field sensors of one pair of magnetic field sensors are each arranged at the same angle relative to the longitudinal axis of the current transferring conductor, thus forming the V-shape arrangement of the magnetic field sensors of one pair of magnetic field sensors both on the upper face of the current transferring conductor and on the lower face of the current transferring conductor.

The V-shaped arrangement of the two magnetic field sensors of one pair of magnetic field sensors on the upper side and on the lower side of the beam, respectively leads to opposite signals of both sensing channels CH1 and CH2.

By way of example, if channel CH1 outputs a signal 4 (positive) than the channel CH2 outputs an opposite signal −4 (negative).

The magnetic field sensors of the sensing channels CH1 and CH2 may be arranged in a vertical distance relative to the current transferring conductor, with the distances ranging from 1.45 mm to 7.5 mm.

Also, each magnetic field sensor may have different numbers of windings.

Support Element

The support element carries at least one magnetic field sensor.

The support element provides at least one face on which at least one magnetic field sensor is arranged.

It goes without saying that the support element may comprise two or more faces.

Thus, the support element may have a rectangular shape with the two faces of the support element are facing away from each other.

The support element in form of a rectangular body may also have more than two faces to carry magnetic field sensors.

Each of the faces of the support element carries at least one magnetic field sensor.

The support element is positioned in the vicinity of the current transferring conductor.

In its position adjacent to the current transferring conductor the support element is arranged in an angle relative to the magnetic field of the current transferring conductor, produced by the current flowing through the current transferring conductor.

The magnetic field of the current transferring conductor is referred to in more detail below.

In one embodiment of the invention the support element carrying at least four magnetic field sensors is clipped onto the current transferring conductor.

The support element may be clipped onto the current transferring conductor, providing a friction lock.

The support element may also be clipped onto the current transferring conductor by means of a form-fitted link or by a fabric-blocked link.

The support element may comprise a flat sheet of insulating material.

The support element may further comprise a layer of copper foil being laminated to the support element.

The support element may be any form of a substrate.

By way of example the support element is a printed circuit board which mechanically supports and electrically connects electrical or electronic components.

The support element has at least one conductive track or at least one conductive pad and/or other features etched from one or more sheet layers of copper laminated onto and/or between sheet layers of a non-conductive substrate.

As referred to above, the support element may be single-sided or double-sided.

The single-sided support element comprises one copper layer, whereas the double-sided support element carries copper layers on both faces of one support element.

The support element may provide a multitude of faces, wherein each face of the support element may carry at least one magnetic field sensor.

By way of example, there are two support elements. Each support element faces one of two opposing faces of the current transferring conductor. Each support element carries one pair of magnetic field sensors. Each magnetic field sensor of the pair of magnetic field sensors is assigned to different sensing channels CH1 and CH2, respectively.

Magnetic Field Sensor

The magnetic field sensor can also be an electro-magnetic sensor.

The magnetic field sensor interacts with the magnetic field created by a current flowing through the current transferring conductor.

According to the invention, the electric current flows through the current transferring conductor, thus generating a magnetic field.

According to one embodiment of the invention, the magnetic field sensor is connected with the support element and/or with another magnetic field sensor and/or with the current transferring conductor in a common mode rejection.

The common mode rejection indicates how little the output voltage changes when two input voltages of an electrical differential amplifier change by the same amount.

Thus, the two input voltages of the electrical differential amplifier change in a common mode.

Another embodiment of the invention provides at least two magnetic field sensors arranged in an angle relative to a longitudinal axis of the current transferring conductor, respectively.

The angles of the magnetic field sensors relative to the longitudinal axis differ from one another.

To maintain a certain position relative to the longitudinal axis of the current transferring conductor the at least two, preferably four, magnetic field sensors are mounted onto a support element.

Thus, the magnetic field sensors may be positioned in an angle between zero and ninety degrees relative to the longitudinal axis of the current transferring conductor.

The magnetic field sensor can also be placed at any other angle relative to the longitudinal axis of the current transferring conductor.

In another embodiment of the invention the magnetic field sensor extends along the longitudinal axis of the current transferring conductor.

According yet to another embodiment of the invention at least two magnetic field sensors are arranged transverse to the longitudinal axis.

Following the angular orientation of the magnetic field sensor relative to the longitudinal axis of the current transferring conductor the angular orientation of the magnetic field sensor relative to the magnetic field is changed.

In other words, the angular orientation of the magnetic field sensor relative to the longitudinal axis of the current transferring conductor influences the angular orientation of the magnetic field sensor relative to the magnetic field generated by a current flowing through the current transferring conductor.

The angular orientation of the magnetic field sensor relative to the magnetic field, generated by the current flowing through the current transferring conductor determines the sensitivity of the magnetic field sensor.

According to another embodiment of the invention the magnetic field sensor is arranged on the face of the support element directed towards the current transferring conductor.

Another embodiment of the invention provides the magnetic field sensor on the face of the support element facing away from the current transferring conductor.

At least one magnetic field sensor may be arranged on both faces of the support element.

According to a further embodiment of the invention, at least two support elements may be arranged at one side of the current transferring conductor.

The at least two support elements can be arranged axially relative to the current transferring conductor.

Also, the at least two support elements can be arranged radially relative to the current transferring conductor.

The at least two support elements, arranged radially and/or axially relative to the current transferring conductor may provide at least one magnetic field sensor. At least two magnetic field sensors may be positioned on each of the faces of the support elements.

A further embodiment of the invention shows at least two magnetic field sensors being arranged on each face of the support element. Wherein, the faces of the support elements are facing away from each other.

This embodiment provides at least two magnetic field sensors showing in opposite directions relative to each other.

Also the magnetic field sensors are arranged at different distances relative to the current transferring conductor.

According to another embodiment of the invention the magnetic field sensors are arranged symmetrically to each other on the faces of the support element.

It goes without saying that the magnetic field sensors may also be arranged asymmetrically to each other on the faces of the support element.

The axis of symmetry may be perpendicular to the support element.

By way of example, the axis of symmetry may also extend in the plane passing through the support element.

Another embodiment of the invention reveals that the magnetic field sensor sensing the magnetic field has a sensitivity.

The sensitivity depends on a location of the magnetic field sensor relative to the current transferring conductor.

It may also depend on an angular orientation of the magnetic field sensor relative to the current transferring conductor.

Alternatively, the sensitivity may also depend on a distance of the magnetic field sensor relative to the current transferring conductor.

The sensitivity of the magnetic field sensor comprises all values, including the maximum and the minimum values of applied current parameters that can be measured.

The sensitivity of the magnetic field sensor inter alia depends on the angular orientation of the magnetic field sensor relative to the longitudinal axis of the current transferring conductor.

Another embodiment of the invention provides a housing which includes one or more of the magnetic field sensors and of the support elements.

The housing surrounds the magnetic field sensors and/or the support element and/or the current transferring conductor at least partially.

The housing helps to protect the enclosed components from contamination and/or from damage.

Current Transferring Conductor

The current transferring conductor conducts current.

The ability of the current transferring conductor to allow current to flow through is called electrical conductivity.

Usually the current transferring conductor is manufactured from at least one metal. Among other metals, the current transferring conductor may be made from copper.

The current transferring conductor may also comprise an alloy of a variety of metals.

Another embodiment of the invention reveals a current transferring conductor in form of a busbar.

The busbar can be made of a rectangular flat metal body. The busbar may be a flat stripe. It may also be provided as a solid bar or a rod. Busbars can be formed in a number of different shapes.

The busbar is made for distributing high current power.

Busbars are usually uninsulated. They have a sufficient stiffness.

Usually, busbars are composed of copper, brass or aluminium.

Current Transferring Conductor and the Magnetic Field

A current flowing through the current transferring conductor produces a magnetic field. The magnetic field runs perpendicular to the current flowing through the current transferring conductor.

Simply by way of example, the current is flowing along the longitudinal axis of the current transferring conductor generating a magnetic field. The magnetic field extends radially relative to the longitudinal axis of the current transferring conductor.

In their radial course around the current transferring conductor, the lines of the magnetic field run relative to the longitudinal axis of the current transferring conductor radially on one side of the current transferring conductor from top to bottom.

On the other side of the current transferring conductor, the lines of the magnetic field run radially relative to the current transferring conductor from bottom to top, relative to the longitudinal axis of the current transferring conductor.

The direction of the radial path of the lines of the magnetic field around the current transferring conductor depends on the direction in which the current flows through the beam.

Furthermore, the magnitude of the magnetic field is proportional to the amount of current flowing through the current transferring conductor.

The radiant of the magnetic field is influenced by the geometry of the current transferring conductor.

The corners of a current transferring conductor of a rectangular shape (such as: busbar) influence the magnetic field of the current transferring conductor. Thus, at distances close to the current transferring conductor (busbar) the magnetic fields would resemble an ellipse.

According to a further embodiment of the invention the current transferring conductor has a bore.

The support element carrying at least two magnetic field sensors extends through the bore of the current transferring conductor.

Extending through the bore of the current transferring conductor the support element has an angular orientation, preferably rectangular, to the current transferring conductor.

Also, the support element extending through the bore of the current transferring conductor has a perpendicular orientation relative to the magnetic field.

The bore being placed in the centre of the current transferring conductor splits the current into two equal parts.

The magnetic fields generated by the current flowing through the current transferring conductor creates opposite gradients inside the bore.

The magnetic field runs perpendicular to the current flowing through the current transferring conductor. Thus, the magnetic field concentrates towards the centre of the bore of the current transferring conductor. The bore of the current transferring conductor causes the magnetic field to have a 3-dimensional aspect.

Extending through the bore of the current transferring conductor the support element can be placed in parallel with the current flowing through the current transferring conductor.

In the bore, the support element can also be in position rectangular to the direction of the flow of the current within the current transferring conductor.

DESCRIPTION OF THE DRAWINGS

The invention is explained in more detail below by way of four examples, wherein.

DETAILED DESCRIPTION

Figure 1:
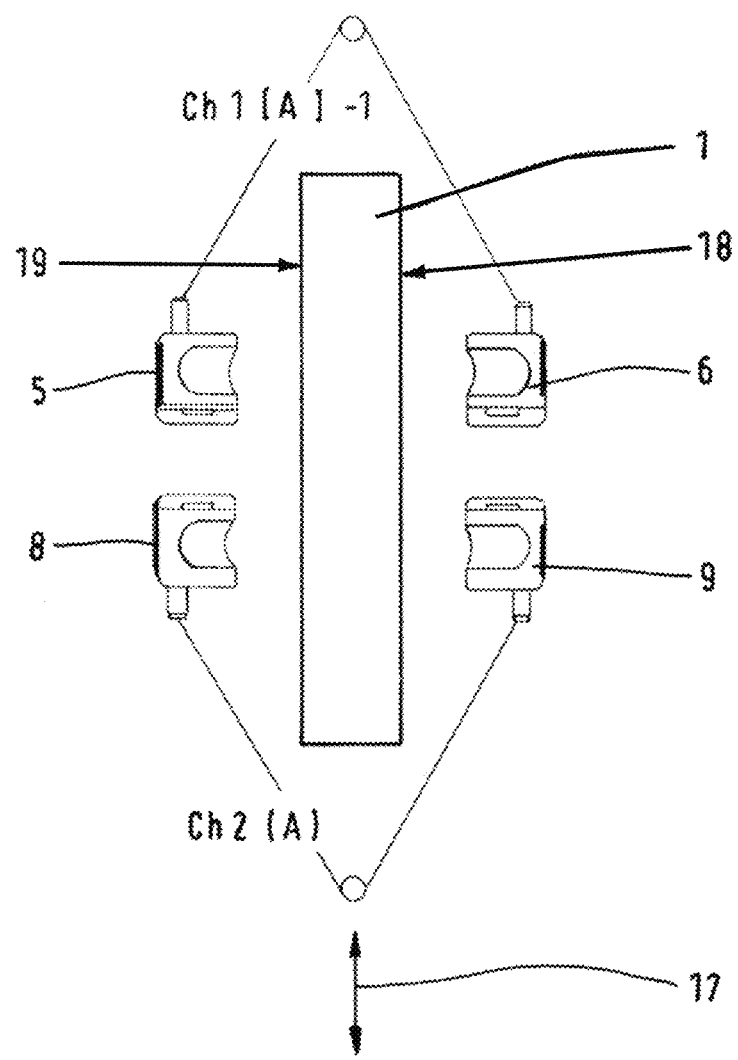
FIG. 1 shows a current transferring conductor (busbar) with two sensing channels which as an alternative can be connected to one which result in the loss of external magnetic field diagnostic ability but final output is identical to CH1-CH2.

In the FIG. 1 the current transferring conductor 1 (busbar) is cut transversely to its longitudinal axis 17.

The current transferring conductor 1 has two opposing faces 18,19. The opposing face 18 is the lower face of the current transferring conductor 1. The opposing face 19 is the upper face of the current transferring conductor 1 relative to the longitudinal axis 17 of the current transferring conductor 1.

In the FIG. 1 there are two sensing channels, referred to as CH1, CH2, each having two sensing magnetic field sensors 5,6,8,9 respectively, which could be connected into a single channel alternatively.

In the FIG. 1 the magnetic field sensors 5,6 are assigned to the sensing channel CH1.

The opposing magnetic field sensors 8,9 are assigned to the sensing channel CH2.

Figure 2:
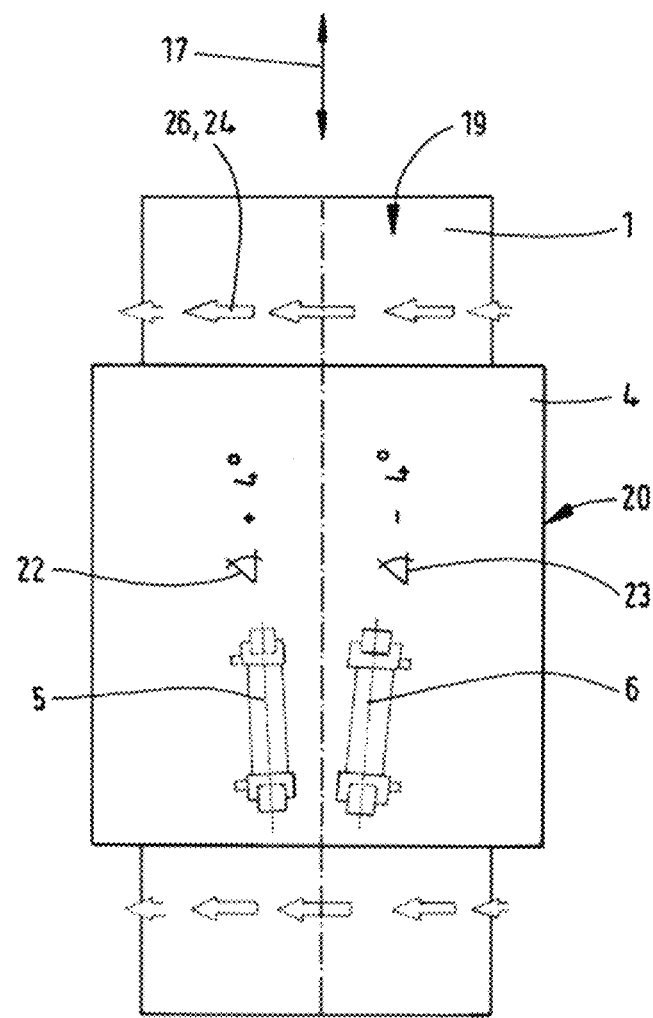
FIG. 2 shows the current transferring conductor with a support element, carrying two magnetic field sensors.

The FIG. 2 shows a top view of the current transferring conductor 1 showing the opposing face 19 of the current transferring conductor 1.

Parallel to the opposing face 19 of the current transferring conductor 1 and along the longitudinal axis 17 of the current transferring conductor 1 there is the support element 4.

The FIG. 2 shows the magnetic field sensors 5,6 arranged on a face 20 of the support element 4 showing towards the opposing face 19 (upper face) of the current transferring conductor 1.

On the face 20 of the support element 4 the magnetic field sensors 5,8 are arranged opposite to each other in acute angles 22,23 relative to the longitudinal axis 17 of the current transferring conductor 1, respectively.

A magnetic field 24 is created when a current 25 is applied to the current transferring conductor 1.

Magnetic lines 26 of the magnetic field 24 run radially transfers to the longitudinal axis 17 of the current transferring conductor 1.

Figure 3:
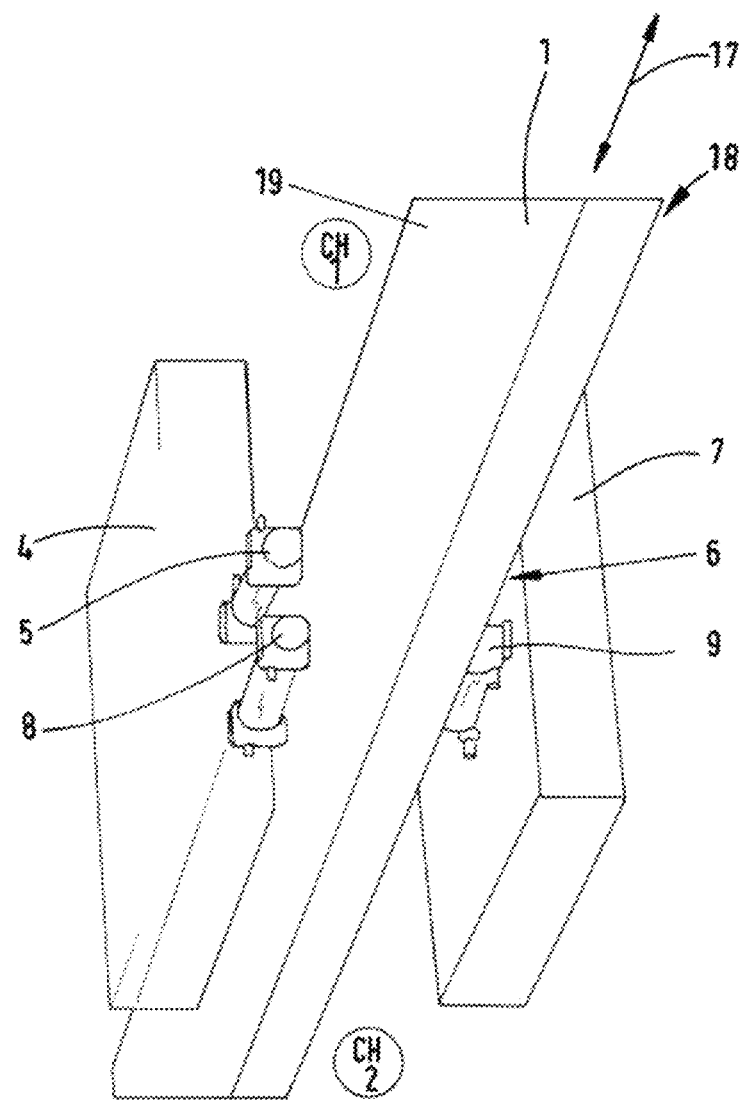
FIG. 3 shows the current transferring conductor and two support elements carrying magnetic field sensors, with the magnetic field sensors facing the upper face and the lower face of the current transferring conductor.

The FIG. 3 shows a perspective view of the current transferring conductor 1.

Close to the opposing faces 18,19 (lower face 18; upper face 19) of the current transferring conductor 1 the support elements 4,7 are arranged.

In the FIG. 3, the support element 4 carries the magnetic field sensors 5 and 8.

The support element 7 carries the magnetic field sensors 6 and 9.

At least two magnetic field sensors 5,6 and 8,9, respectively are arranged on the opposing faces 18,19 of the current transferring conductor 1. The magnetic field sensors 5 and 6 are allocated to the sensing channel CH1. Whereas the magnetic field sensors 8 and 9 are allocated to the sensing channel CH2.

In other words, the sensing channel CH1 connects the magnetic field sensors 5 and 6. Whereas the sensing channels CH2 connects the magnetic field sensors 8 and 9.

Both the FIG. 1 and the FIG. 3 show that the magnetic field sensors 5 and 6 of the sensing channel CH1 are looking towards opposing faces 18 and 19 (lower face 18; upper face 19) of the current transferring conductor 1, respectively.

Also, the magnetic field sensors 8 and 9 of the sensing channel CH2 are looking towards opposing faces 18 and 19 (lower face 18; upper face 19) of the current transferring conductor, relative to each other.

On each opposing face 18 and 19 of the current transferring conductor 1 the magnetic field sensors 5,8 are arranged in an acute angle 22 relative to the longitudinal axis 17 of the current transferring conductor 1. The magnetic field sensors 6 and 9 are arranged in an acute angle 23 relative to the longitudinal axis 17 of the current transferring conductor 1.

On both opposing faces 18 and 19 (lower face 18; upper face 19) of the current transferring conductor 1 the magnetic field sensors 5,8 and 6,9 are arranged in acute angles 22 and 23 relative to the longitudinal axis 17 of the current transferring conductor 1.

Figure 4:
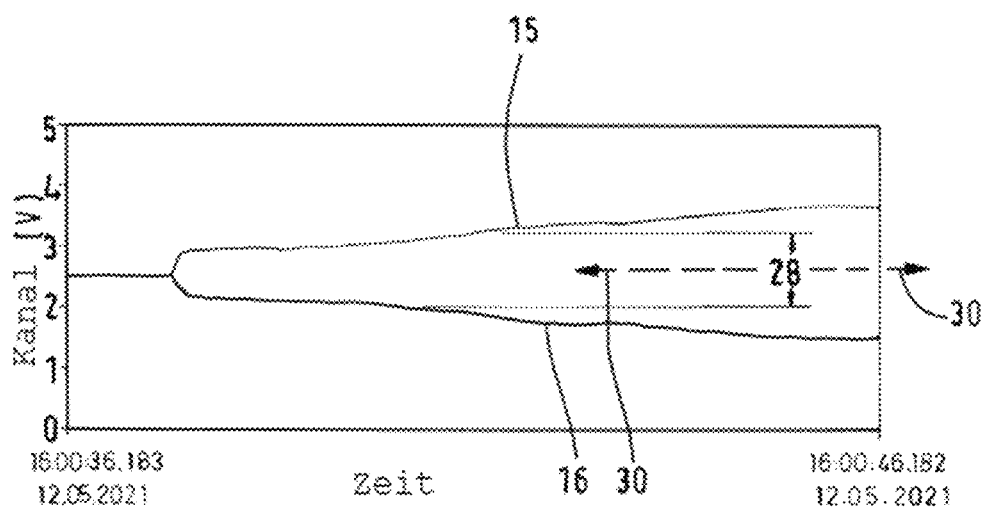
FIG. 4 shows a coordinate system with two curves representing the signal values (raw output) of the individual channels CH1 and CH2 in V (Volt).
Figure 10:
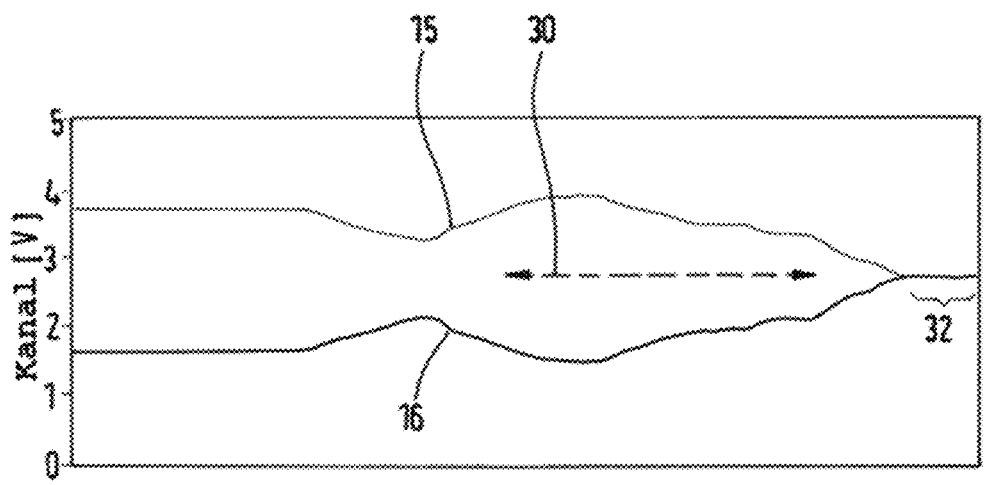
Figure 11:
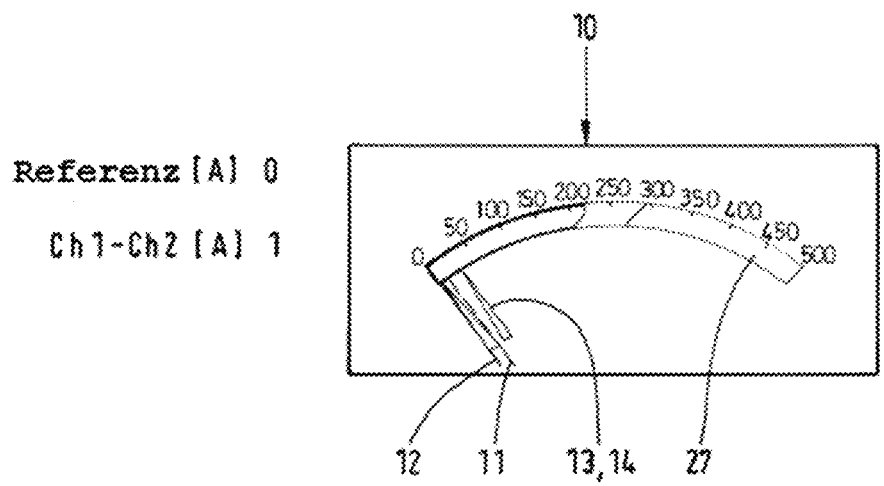
FIG. 11 also shows a meter in plain view representing a corresponding current value in A (Ampere) under the influence of the external magnetic field.

Throughout the FIG. 4 to the FIG. 11 the meter 10 shows a scale 27 displaying Ampere (A) values from zero to 500. The scale 27 of the FIGS. 4 to 11 comprises four pointers 11,12,13,14.

The pointer 11 represents a reference value in Ampere (A).

The pointer 12 gives a difference value in Ampere (A) obtained by subtracting the signal value in Ampere (A) sensed by the sensing channel CH2 from the signal value in Ampere (A) sensed by the sensing channel CH1 which as an alternative can be achieved by connecting all 4 magnetic field sensors in one electronic channel. The individual signal values (A) sensed by the sensing channel CH1 and by the sensing channel CH2 respectively, are created when a current 25 is applied to the current transferring conductor 1.

Throughout the FIG. 4 to the FIG. 11 the pointer 13 of the meter 10 represents the sensing channel CH1. A pointer 14 represents the sensing channel CH2.

In the example of FIG. 4 a current of a reference value of 256 Ampere (A) is applied to the current transferring conductor 1.

In the example of FIG. 4 the current 25 will be increased from approximately zero (0) to an Ampere value of approximately 256 A.

The coordinate system of FIG. 4 shows the curve 15 and the curve 16. The curve 15 represents the sensing signals of the sensing channel CH1 whereas the curve 16 is associated to the sensing channel CH2.

According to the V-shaped arrangement of the magnetic field sensors 5,6,8,9 of the sensing channels CH1 and CH2 the curves 15 and 16 of the sensing values in Ampere (A) of the sensing channels CH1 and CH2 are aligned in opposite directions relative to each other.

In the FIG. 4 the current 25 is increased to a value of approximately 256 A. In the FIG. 4 the current is held at a constant level of 256 A resulting in a parallel arrangement of the curves 15 and 16 in an area 28.

In the coordinate system of the FIG. 4 the two curves 15,16 have a same distance 29 relative to a reference line 30. The reference line 30 corresponds to the reference value of 256 A in the coordinate system of FIG. 4.

In the meter 10 shown in the FIG. 4 the pointer 11 represents the reference value of the current 25 of 256 A applied to the current transferring conductor 1.

Figure 5:
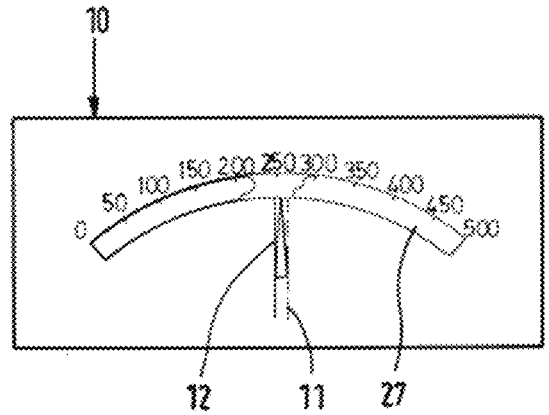
FIG. 5 also shows a meter in plain view representing a corresponding current value in A (Ampere)
Figure 6:
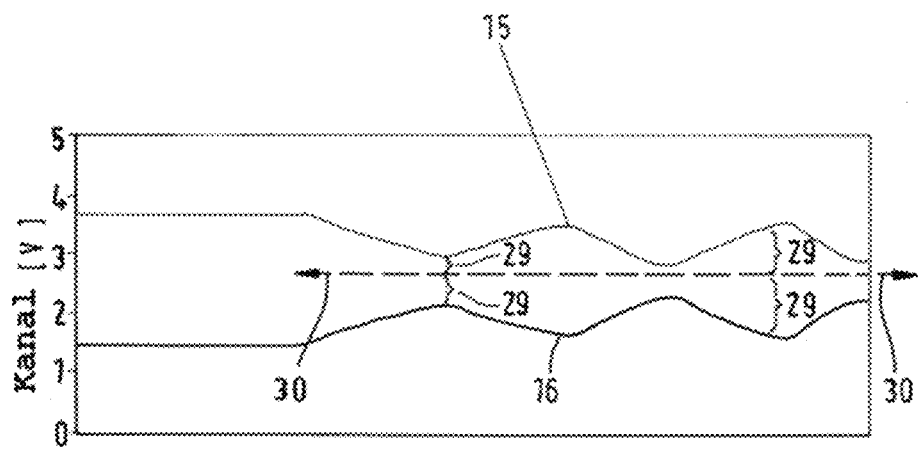
FIG. 6 shows a coordinate system according to the FIG. 4 with two curves representing varying current values in V (Volt) applied to the current transferring conductor, the FIG. 7 also shows a meter in plain view representing a corresponding current value in A (Ampere)

The FIG. 5 corresponds to the illustration of the FIG. 4, wherein in the FIG. 5 the current 25 in Ampere (A) applied to the current transferring conductor 1 (not shown) varies.

The varying current values in A are sensed by the magnetic field sensors 5,6,8,9 of the two sensing channels CH1 and CH2.

When the current value 25 in A (Ampere), applied to the current transferring conductor 1 is increased, the distances 29 of the individual curves 15,16 of the sensing channels CH1 and CH2 to the reference line 30 increase as well.

When the current value 25 in A (Ampere), applied to the current transferring conductor 1 is reduced, the distances 29 of the curves 15,16 of the sensing channels CH1 and CH2 to the reference line 30 decrease as well.

The meter 10 of the FIG. 5 shows the pointer 12 giving a difference value in Ampere (A) obtained by subtracting the signal value in Ampere (A) sensed by the sensing channel CH2 from the signal value in Ampere (A) sensed by the sensing channel CH1.

Figure 8:
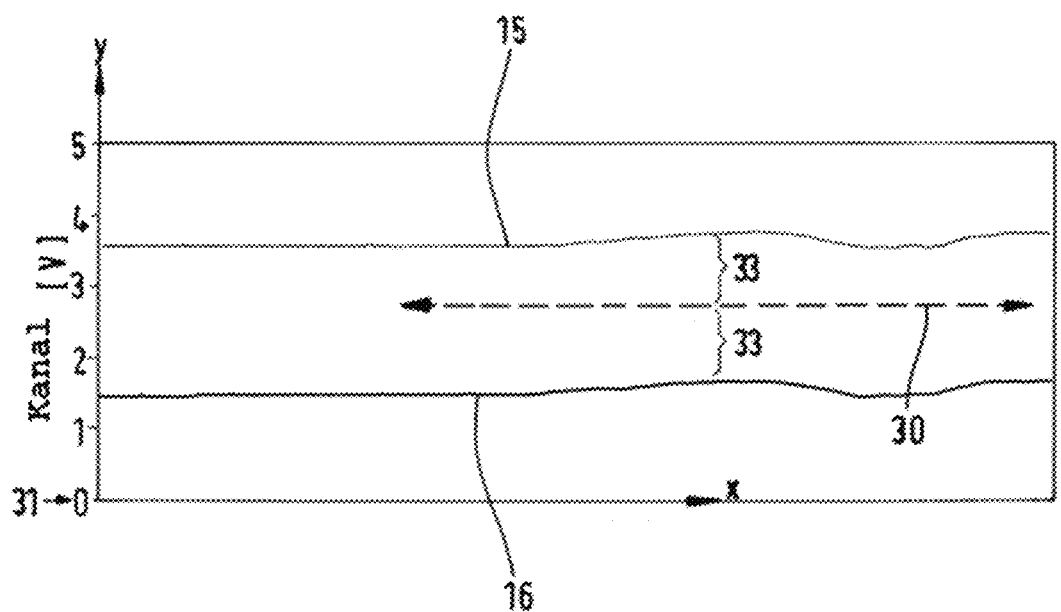
FIG. 8 shows a coordinate system according to the FIG. 4 with two curves representing current values in V (Volt) under the influence of a varying external magnetic field

The coordinate system of the FIG. 8 shows the influence of an external magnetic field on the values in A (Ampere), sensed by the magnetic field sensors 5,6,8,9 of the sensing channels CH1 and CH2.

The corresponding curves 15 and 16 of the sensing channels CH1 and CH2 shown in the coordinate system of the FIG. 8 run at the same distance 33 to the reference line 30.

When the strength of the external magnetic field increases or decreases, the two curves 15 and 16 representing the current values in A, sensed by the sensing channels CH1 and CH2, shift parallel to each other along the Y-axis of the coordinate system of FIG. 8.

When the strength of the external magnetic field increases, the two curves 15,16 representing the current values in A (Ampere) move parallel to each other in a direction away from a zero point 31 of the coordinate system.

When the strength of the external magnetic field decreases, the two curves 15,16 representing the current values in A sensed by the magnetic field sensors 5,6,8,9 of the sensing channels CH1 and CH2 move parallel to each other towards the zero point 31 of the coordinate system of FIG. 8.

Figure 9:
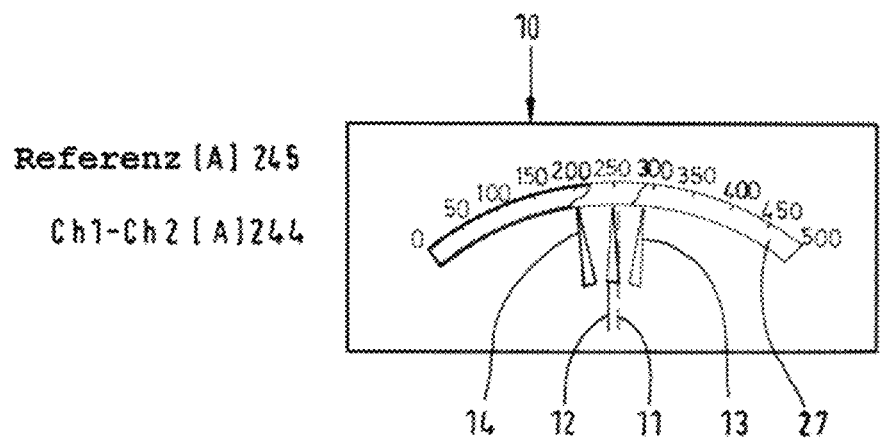
FIG. 9 shows a meter in plain view representing a corresponding current value in A (Ampere) and FIG. 10 shows a coordinate system according to the FIG. 4 with two curves representing current values in V (Volt), with the current applied to the current transferring conductor cut back to zero.

In the meter 10, shown in the FIG. 9 the pointer 14 represents the values in A, sensed by the sensing channel CH2.

In the meter 10, shown in the FIG. 9 the pointer 13 represents the values in A, sensed by the sensing channel CH1.

The meter 10 of the FIG. 9 shows the pointer 12 arranged in the middle between the pointers 13 and 14. The pointer 12 giving a difference value in Ampere (A) obtained by subtracting the signal value in Ampere (A) sensed by the sensing channel CH2 from the signal value in Ampere (A) sensed by the sensing channel CH1.

In the FIG. 10 the current value 25 in A (Ampere) is reduced to zero. However, the influence of the external magnetic field remains present in the representation of the FIG. 7.

Figure 7:
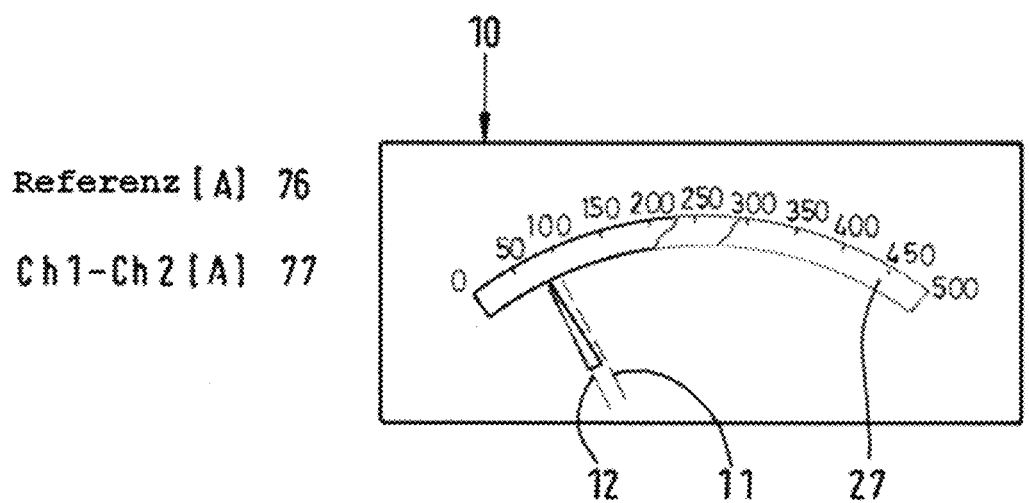

By returning the current value 25 in A (Ampere) to zero, in the coordinate system of the FIG. 7; 10 the curves 15 and 16, representing the current values in A of the sensing channel CH1 and of the sensing channel CH2 are merged.

In an area 32 both the curves 15 and 16 run congruently relative to the X-axis of the coordinate system along the reference line 30.

In the FIG. 10 the current 25 is reduced to zero.

When the current 25 is reduced to zero, the pointer 11 representing the reference value in Ampere (A) and the pointer 12 point to zero.

The pointer 12 shown in the FIG. 10 gives the difference value in Ampere (A) obtained by subtracting the signal value in Ampere (A) sensed by the sensing channel CH2 from the signal value in Ampere (A) sensed by the sensing channel CH1.

In the FIG. 10 the presence of the external magnetic field is represented by the value in A (Ampere) shown by the pointer 13. The value in A (Ampere) shown by the pointer 13 represents the influence of the external magnetic field on the channels CH1 and CH2 when the current 25 applied to the current magnetic field is brought to zero.

LIST OF REFERENCES

1 Current transferring conductor
CH1 Sensing channel
CH2 Sensing channel
4 Support element
5 Magnetic field sensor
6 Magnetic field sensor
7 Support element
8 Magnetic field sensor
9 Magnetic field sensor
10 Meter
11 Pointer; reference value 12 Pointer; difference value between channels CH1 and CH2
13 Pointer; CH1
14 Pointer; CH2
15 Curve; CH1
16 Curve; CH2
17 Longitudinal axis of current transferring conductor
18 Opposing face of current transferring conductor (lower face)
19 Opposing face of current transferring conductor (upper face)
20 Face of the support element
21 Face of the support element
22 Acute angle
23 Acute angle
24 Magnetic field
25 Current
26 Lines of the magnetic field
27 Scale
28 Area
29 Distance
30 Reference line
31 Zero point
32 Area
33 Distance (external magnetic field)

The invention claimed is:

1. A current sensor comprising:
a current transferring conductor to conduct current;
four magnetic field sensors, with the four magnetic field sensors being divided into two pairs of magnetic field sensors; and
support elements,
   wherein the support elements are provided to position the magnetic field sensors radially relative to the current transferring conductor;
wherein two magnetic field sensors are arranged in a V-shaped manner relative on one face of the current transferring conductor and two magnetic field sensors are arranged in the V-shaped manner on another face of the current transferring conductor; and
wherein, of the magnetic field sensors arranged in the V-shaped manner, the ones of each side running parallel to each other.

2. The current sensor according to claim 1, wherein a magnetic field sensor of the pair of magnetic field sensors is connected to the other magnetic field sensor of the pair of magnetic field sensors, to a support element of the support elements, and to the current transferring conductor in a common mode rejection.

3. The current sensor according to claim 1, wherein all the four magnetic field sensors are connected in a common mode rejection creating a double differential.

4. The current sensor according to claim 1, wherein the current transferring conductor is a busbar.

5. The current sensor according to claim 1, wherein a reference sensor is adapted and configured to measure the current applied to the current transferring conductor.

6. A current sensor comprising:
a current transferring conductor to conduct current;
four magnetic field sensors, the four magnetic field sensors being divided into a first pair and a second pair of magnetic field sensors,
   wherein each magnetic field sensor of the first pair of magnetic field sensors is arranged in a V-shaped manner with a respective magnetic field sensor of the second pair of magnetic field sensors relative a face of the current transferring conductor,
   wherein the first pair of magnetic field sensors are running in parallel, and the second pair of magnetic field sensors are running in parallel on respective sides of the current transferring conductor; and
support elements,
   wherein the support elements are provided to position the magnetic field sensors radially relative to the current transferring conductor.

7. The current sensor of claim 6, wherein a magnetic field sensor of the first pair of magnetic field sensors is connected to at least one of the other magnetic field sensor of the first pair of magnetic field sensors, to the support elements, and to the current transferring conductor in a common mode rejection.

8. The current sensor according to claim 6, wherein the support elements further comprise:
a first support element,
   wherein the first support element is provided to position the first pair of magnetic field sensors on a first face of the current transferring conductor, and
a second support element,
   wherein the second support element is provided to position the second pair of magnetic field sensors on a second face of the current transferring conductor.

9. The current sensor according to claim 8, wherein the first support element is opposite the second support element relative the current transferring conductor.

10. The current sensor according to claim 6, wherein the four magnetic field sensors are connected in a common mode rejection creating a double differential.

11. The current sensor according to claim 6, wherein the current transferring conductor is a busbar.

12. The current sensor according to claim 6, wherein a reference sensor is adapted and configured to measure the current applied to the current transferring conductor.

13. A system comprising:
a current transferring conductor;
a first pair of magnetic field sensors,
   wherein the first pair of magnetic field sensors are arranged on a first face of the current transferring conductor;
a second pair of magnetic field sensors,
   wherein the second pair of magnetic field sensors are arranged on a second face of the current transferring conductor; and
support elements,
   wherein the support elements are provided to position the first pair of magnetic field sensors and the second pair of magnetic field sensors radially relative to the current transferring conductor;
wherein each magnetic field sensor of the first pair of magnetic field sensors is arranged in a V-shaped manner with a respective magnetic field sensor of the second pair of magnetic field sensors relative a face of the current transferring conductor; and
wherein the first pair of magnetic field sensors are running in parallel, and the second pair of magnetic field sensors are running in parallel on respective sides of the current transferring conductor.

14. The system of claim 13, wherein a magnetic field sensor of the first pair of magnetic field sensors is connected to at least one the other magnetic field sensor of the first pair of magnetic field sensors, a magnetic field sensor of the second pair of magnetic field sensors, a support element of the support elements, and to the current transferring conductor in a common mode rejection.

15. The system of claim 13, wherein the support elements further comprise:
- a first support element,
    - wherein the first support element is provided to position the first pair of magnetic field sensors on the first face of the current transferring conductor, and
- a second support element,
    - wherein the second support element is provided to position the second pair of magnetic field sensors on the second face of the current transferring conductor.

16. The system of claim 15, wherein the first support element is opposite the second support element relative the current transferring conductor.

17. The system of claim 13, wherein the first pair of magnetic field sensors and the second pair of magnetic field sensors are connected in a common mode rejection creating a double differential.

18. The system of claim 13, wherein the current transferring conductor is a busbar.

19. The system of claim 13, further comprising:
- a reference sensor,
    - wherein the reference sensor is adapted and configured to measure a current applied to the current transferring conductor.

* * * * *